(12) United States Patent
Younkin et al.

(10) Patent No.: US 12,244,315 B2
(45) Date of Patent: Mar. 4, 2025

(54) SYSTEMS AND METHODS FOR REAL-TIME FREQUENCY SHIFT DETECTION VIA A NESTED-MEMS ARCHITECTURE

(71) Applicant: Panasonic Intellectual Property Management Co., Ltd., Osaka (JP)

(72) Inventors: Duane Younkin, Ashburnham, MA (US); Ronald Joseph Lipka, Northborough, MA (US); Ryan Hennessy, Northborough, MA (US); Diego Emilio Serrano, Alpharetta, GA (US); Chihchuan Che, Northborough, MA (US); Amir Rahafrooz, Shaker Heights, OH (US); Mohammad Maymandi Nejad, Hopkinton, MA (US)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 143 days.

(21) Appl. No.: 18/149,275

(22) Filed: Jan. 3, 2023

(65) Prior Publication Data

US 2024/0223169 A1 Jul. 4, 2024

(51) Int. Cl.
*H03K 5/00* (2006.01)
*H03K 21/02* (2006.01)
*H03L 1/02* (2006.01)
*H03L 7/083* (2006.01)

(52) U.S. Cl.
CPC ......... *H03K 5/00006* (2013.01); *H03K 21/02* (2013.01); *H03L 1/02* (2013.01); *H03L 7/083* (2013.01); *H03K 2005/00286* (2013.01)

(58) Field of Classification Search
CPC ............... H03K 5/00006; H03K 21/02; H03K 2005/00286; H03L 1/02; H03L 7/083
See application file for complete search history.

(56) References Cited

U.S. PATENT DOCUMENTS

| 7,369,004 B2 | 5/2008 | Partridge et al. | |
| 2017/0310330 A1* | 10/2017 | Nakajima | H03L 7/095 |
| 2020/0287552 A1* | 9/2020 | Sudo | H03L 1/026 |
| 2024/0223419 A1* | 7/2024 | Younkin | H04L 27/127 |

* cited by examiner

*Primary Examiner* — Jeffrey M Shin
(74) *Attorney, Agent, or Firm* — MCDONALD HOPKINS LLC (57) ABSTRACT

Systems and methods disclosed herein include a correction circuit. The correction circuit may include frequency division circuitry that is configured to receive and condition a reference signal. The correction circuit may include drive circuitry that is configured to receive the reference signal. The correction circuit may include a first resonator that is configured to receive the reference signal. The correction circuit may include sense circuitry that is configured to receive the reference signal from the first resonator. The correction circuit may include phase detector circuitry that is configured to generate at least one output signal based on receipt of a plurality of input signals from the drive circuitry and the sense circuitry. The correction circuit may include a proportional integral derivative controller that is configured to generate a temperature correction signal to correct frequency error in an oscillator based on receipt of the at least one output signal.

20 Claims, 5 Drawing Sheets

SYSTEMS AND METHODS FOR REAL-TIME FREQUENCY SHIFT DETECTION VIA A NESTED-MEMS ARCHITECTURE

TECHNICAL FIELD

The present disclosure relates to frequency shift detection, and more particularly, to systems and methods for real-time frequency shift detection in resonator-based oscillators via a nested MEMS architecture.

BACKGROUND

Timing is at the core of many electronics applications, ranging from data acquisition to telecommunications. Oscillators may be used as clocks to offer high-precision timing for these electronics applications. The core parameters of timing oscillators may include cost, power consumption, size, precision, accuracy, frequency stability over temperature, jitter, and phase noise, with different applications requiring different specifications for each of these parameters. High performance applications, such as computer networking and telecommunications, require clocks with very low jitter and very high temperature stability, often at the expense of cost and size. In addition, MEMS resonators may be prone to fabrication errors and/or outside stress. These and other deficiencies exist.

BRIEF SUMMARY

Embodiments of the present disclosure provide a correction circuit. The correction circuit may include frequency division circuitry that is configured to receive and condition a reference signal. The correction circuit may include drive circuitry that is configured to receive the reference signal from the frequency division circuitry. The correction circuit may include a first resonator that is configured to receive the reference signal from the drive circuitry. The correction circuit may include sense circuitry that is configured to receive the reference signal from the first resonator. The correction circuit may include phase detector circuitry that is configured to generate at least one output signal based on receipt of a plurality of input signals from the drive circuitry and the sense circuitry. The correction circuit may include a proportional integral derivative controller that is configured to generate a temperature correction signal to correct frequency error in an oscillator based on receipt of the at least one output signal from the phase detector circuitry.

Embodiments of the present disclosure provide an oscillator system. The oscillator system may include a first resonator. The oscillator system may include a correction circuit. The oscillator system may include output conditioner circuitry. The correction circuit may include frequency division circuitry that is configured to receive and condition a reference signal from the first resonator. The correction circuit may include drive circuitry that is configured to receive the reference signal from the frequency division circuitry. The correction circuit may include a second resonator that is configured to receive the reference signal from the drive circuitry. The correction circuit may include sense circuitry that is configured to receive the reference signal from the second resonator. The correction circuit may include phase detector circuitry that is configured to generate at least one output signal based on receipt of a plurality of input signals from the drive circuitry and the sense circuitry. The correction circuit may include a proportional integral derivative controller that is configured to generate a temperature correction signal to correct frequency error in the oscillator based on receipt of the at least one output signal from the phase detector circuitry.

Embodiments of the present disclosure provide a method. The method may include transmitting a reference signal. The method may include conditioning the reference signal. The method may include transmitting the conditioned reference signal. The method may include generating a first output signal based on the conditioned reference signal. The method may include generating a second output signal based on receipt of the first output signal and a third output signal. The method may include generating a fourth output signal including a temperature correction signal to correct frequency error in an oscillator based on receipt of the second output signal.

DETAILED DESCRIPTION

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

The systems and methods disclosed herein may be configured to detect, in real-time, frequency shifts from a nominal value using a nested-MEMS architecture. In particular, two MEMS resonators may be used, at different natural resonant frequencies, to generate a source frequency and a temperature compensation signal. One of the two MEMS resonators, such as the primary MEMS resonator, may be configured to generate a reference clock. The other of the two MEMS resonators, such as the secondary MEMS resonator, may be configured to generate a frequency correction signal that may be used to correct frequency errors due to, for example, stresses or external temperature changes. Detection and correction of the resonator frequency shift is an imperative function of maintaining a constant frequency.

In comparison with conventional temperature sensor correction methods, the systems and methods disclosed herein offers several advantages. First, the temperature correction signal is a direct function of the two highly correlated low-noise MEMS resonators. There is no need to directly measure the temperature with a sensor that may introduce error in precision or accuracy. Second, exposure to stress and aging are common between the two resonators, whereby the systems and methods disclosed herein may reduce aging and accuracy concerns. In some examples, aging may refer to change of a nominal frequency of the resonator over a predetermined duration of time, which may be caused by physical changes to the resonator itself. These physical changes may be associated with specific components constituting the resonator, including but not limited to the body, springs, and/or damping sources. A variety of frequency error sources, including but not limited to heat/temperature, pressure, environmental stresses, and aging, may be further mitigated by manufacturing both the first and second resonators into the same body. In some examples, a resonator may operate at a single resonance mode, in which there may be two resonators formed out of a single common material substrate, such as silicon, in the case of a MEMS resonator. In other examples, a single body may operate at two or more resonance modes, in which case it may be referred to as two resonators manufactured out of the same body. Third, an active feedback loop that is configured to maintain a constant phase through the secondary MEMS resonator allows for design approaches that may be configured to reduce domain conversion noise, customize precision, and shape system noise. Fourth, a high-quality MEMS resonator has a very high phase sensitivity near the natural resonance. Correspondingly, the sensitivity of an output signal generated by a controller, such as a nested-MEMS correction signal, is also very high. This allows for a particular correction signal with a high sensitivity. The systems and methods disclosed herein has a large sensitivity, low overall noise, and is configured to detect, in real-time, a resonator frequency shift due to one or more sources, for example heat/temperature, environmental temperature stresses, and/or aging.

Figure 1:
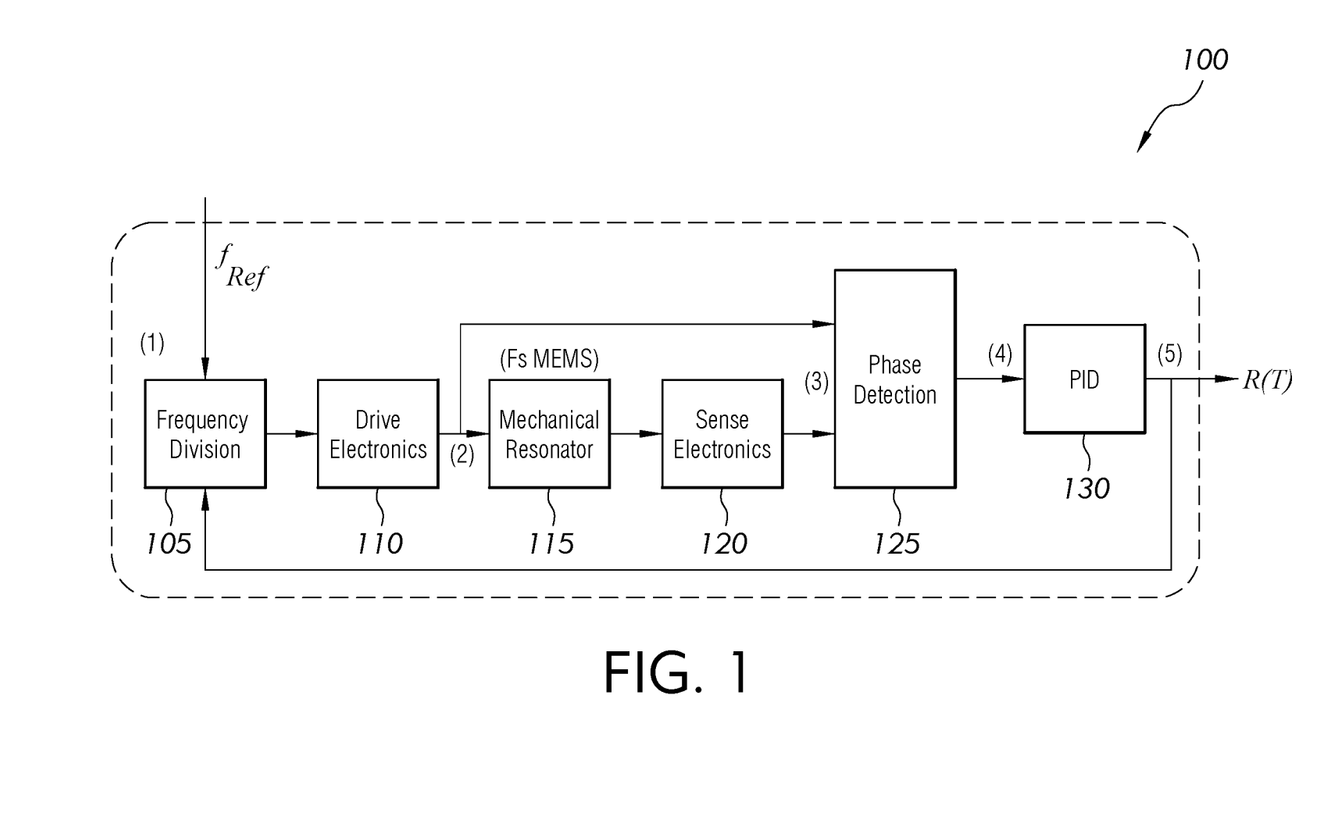
FIG. 1 illustrates a correction circuit according to an example embodiment.

FIG. 1 illustrates a correction circuit according to an example embodiment. The correction circuit 100 may include frequency division circuitry 105; drive circuitry 110; a resonator 115; sense circuitry 120; phase detector circuitry 125; and a proportional integral derivative controller 130. Although FIG. 1 illustrates single instances of the components of the circuit 100, it is understood that any number of components of the circuit 100 may be included.

A feedback loop may be utilized by, for example, the correction circuit 100 and configured to maintain a zero-degree phase shift of an AC drive signal through a resonator 115. In some examples, the resonator 115 may comprise a second resonator, such as a secondary MEMS resonator or a nested resonator. An input signal to the feedback loop may be sourced by a primary MEMS resonator (not shown). The input signal may comprise the source frequency for a frequency division circuit, such as the frequency division circuitry 105. The frequency division circuitry 105 may be configured to receive and condition, such as divide a frequency of, a reference signal. In some examples, the reference signal may include a reference clock signal, such as a micro-electromechanical system (MEMS) resonator frequency ($f_{ref}$). The frequency division circuitry 105 may be configured to generate a drive signal for the resonator 115. The drive signal may be driven by drive circuitry 110. Input and output channels of the resonator 115 may be each fed into the phase detector circuitry 125. For example, the drive signal that is input to the resonator 115 may be transmitted directly to the phase detector circuitry 125. An output of the resonator 115 may be transmitted to the phase detector circuitry 125 via sense circuitry 120.

The phase detector circuitry 125 may be configured to receive a plurality of input signals and generate at least one output signal. An output of the phase detector circuitry 125, such as the at least one output signal, may serve as an input to the proportional integral derivative controller 130. In some examples, the phase detector circuitry 125 may be configured to operate as a comparator that is configured to compare the phase of the received plurality of input signals, such as a first and second input signal, to generate the at least one output signal. The proportional integral derivative controller 130 may be configured to adjust a frequency of an input to the frequency division circuitry 105 and drive frequency to the resonator 115. By maintaining a zero-degree phase shift through the resonator 115, the drive frequency of the resonator 115 is ensured to be at a natural resonance. As further explained below, an output signal of the proportional integral derivative controller 130 may be a function of both natural frequencies from resonator 115 and another resonator, such as the primary MEMS resonator.

Figure 2:
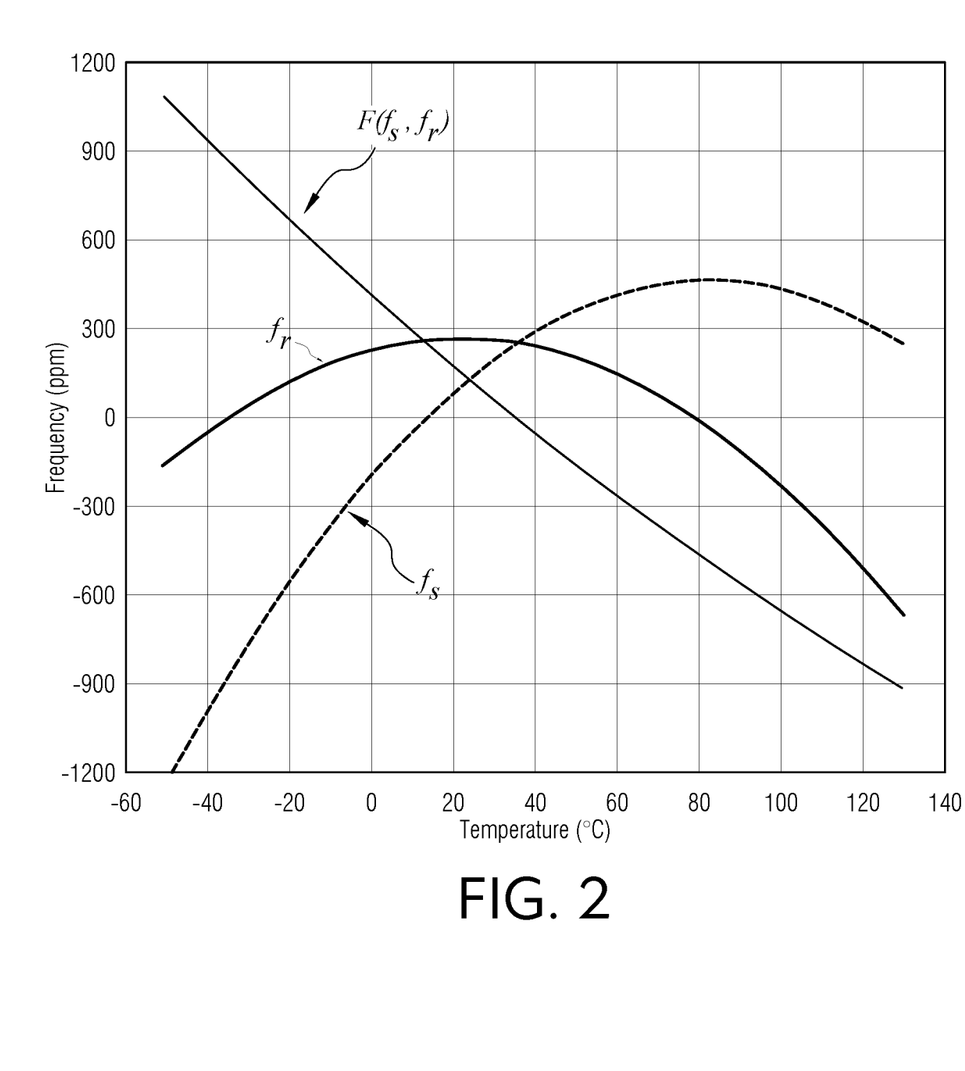
FIG. 2 illustrates a correction signal according to an example embodiment.

FIG. 2 illustrates a correction signal according to an example embodiment. FIG. 2 may reference the same components of circuit 100 as discussed above with respect to FIG. 1. An output signal of the proportional integral derivative controller 130 may be a function of a frequency of the primary MEMS resonator (not shown) and a frequency of the secondary MEMS resonator 115. In some examples, this function may be configured to take into account one or more parameters, such as aging, stress, or the like. The primary MEMS resonator (not shown) and the secondary MEMS resonator 115 may be assumed or configured to experience the same temperature conditions and have a highly correlated resonant frequency response to temperature changes. The output signal of the proportional integral derivative controller 130 may be configured as a temperature correction signal.

Figure 3:
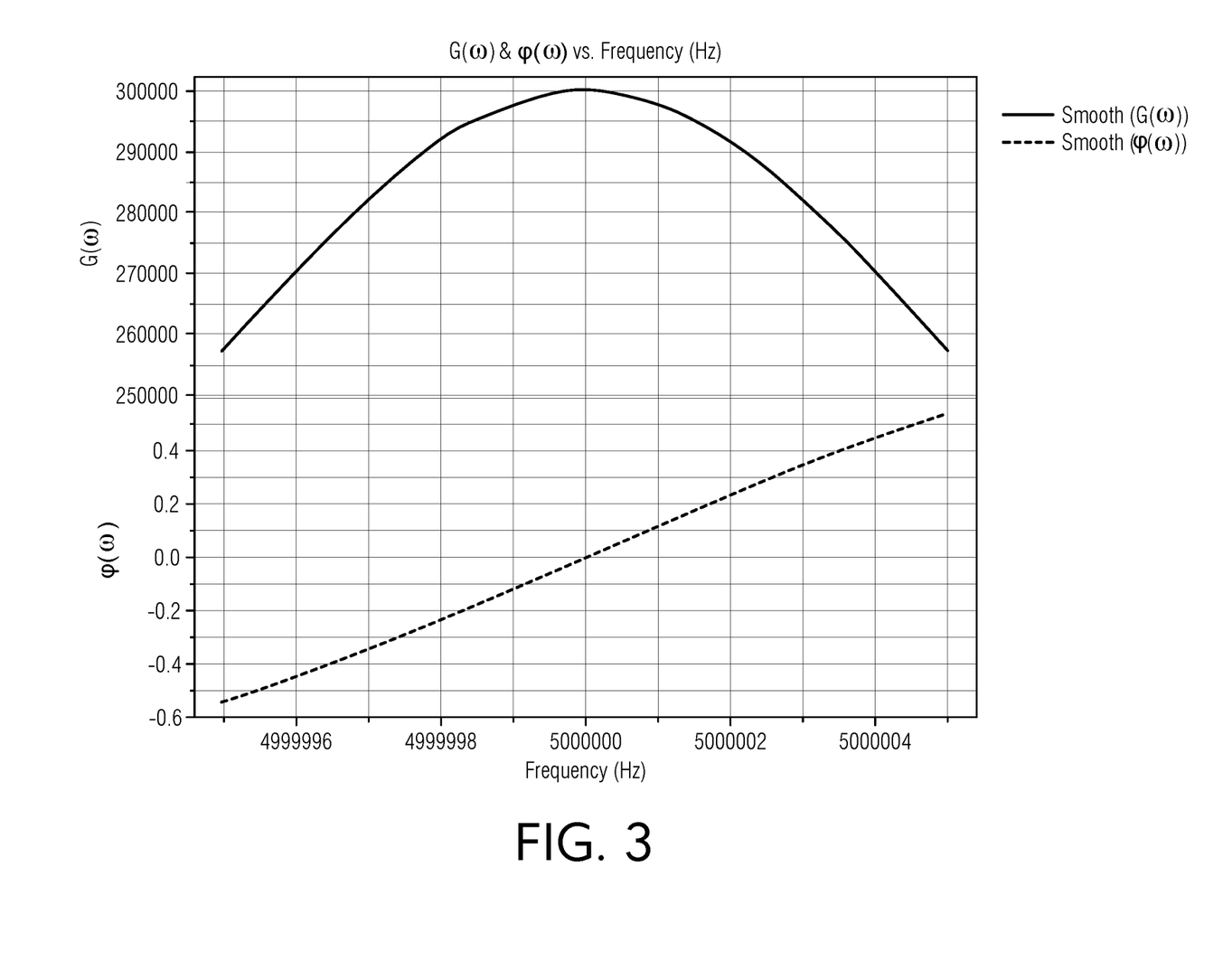
FIG. 3 illustrates a frequency response of a resonator according to an example embodiment.

FIG. 3 illustrates a frequency response of a resonator according to an example embodiment. In particular, a high-quality MEMS resonator phase response is depicted. As observed in FIG. 3, a high-quality MEMS resonator has a very high phase sensitivity near the natural resonance. Correspondingly, the sensitivity of the nested-MEMS correction signal is also very high. This allows for a particular correction signal with a high sensitivity.

Figure 4:
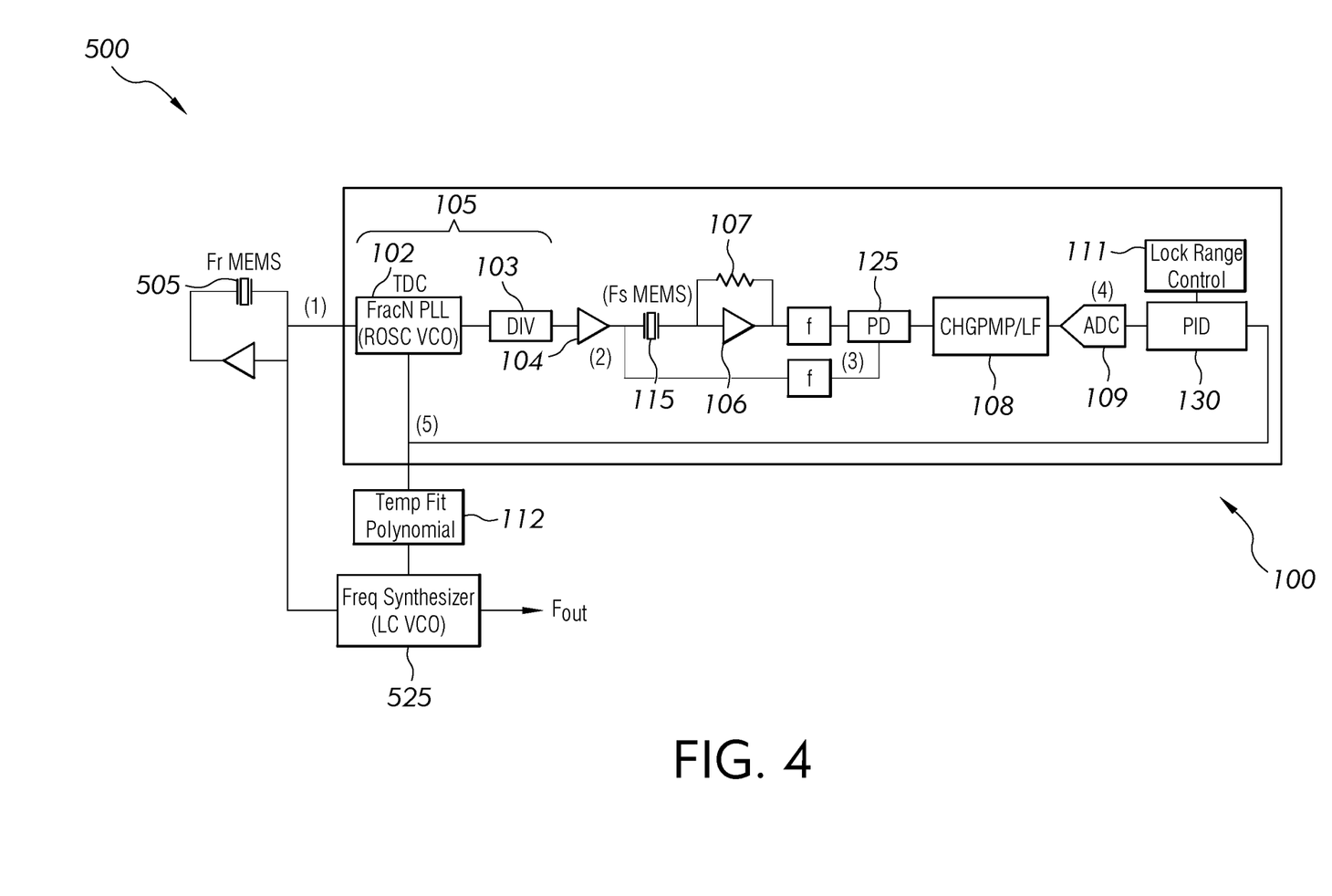
FIG. 4 illustrates a correction circuit according to another example embodiment.

FIG. 4 illustrates an oscillator system according to an example embodiment. As depicted in FIG. 4, an oscillator system 500 may include the correction circuit 100 according to an exemplary embodiment. Without limitation, the oscillator system 500 may comprise a temperature compensated oscillator, mechanical resonators (for example, micro-electromechanical systems (MEMS) resonators, nano-electromechanical systems (NEMS) resonators, bulk acoustic wave (BAW) resonators, surface acoustic wave (SAW) resonators, crystal (XTAL) resonators, film bulk acoustic resonators (FBAR), and the like). The oscillator system 500 may include a resonator 505, a correction circuit 100, polynomial circuitry 112, and a frequency synthesizer 525. The correction circuit 100 may include any of the components of correction circuits 100, as previously described above.

The correction circuit 100 may include frequency division circuitry 105, an amplifier 104, a resonator 115, a transimpedance amplifier 106, a resistor 107, phase detector circuitry 125, a charge pump 108, a converter 109, a proportional integral derivative controller 130, and a lock range controller 111.

In some examples, the frequency division circuitry 105 may include a fractional-N phase locked loop (PLL) 102, a fractional N-divider 103, or any combination thereof.

The amplifier 104 may comprise a conditioner. For example, because the resonator 115 may be a mechanical resonator, the amplifier 104 may be configured to amplify the signal output from the frequency division circuitry 105 to drive the resonator 115.

An output of the resonator 115 may be fed to the transimpedance amplifier 106 which may include a feedback resistor 107. The output of the resonator 115 may comprise a sine wave and may thus be transformed into a square wave for simpler phase detection by the phase detector circuitry 125. In some examples, a value of the feedback resistor 107 may depend on the resonator 115. For example, the gain of a transimpedance amplifier circuit 106 may be based on the value of the feedback resistor 107. The optimum gain of the transimpedance amplifier circuit may depend on an amplitude of an output signal of the resonator 115, which depends upon drive circuitry, sense circuitry, and characteristics of the primary resonate mode. Drive circuitry and sense circuitry may refer to respective circuitry 110 and 120, as further disclosed below. It is understood that the transimpedance amplifier 106 may include additional circuit elements, such as one or more capacitors (not shown) and one or more additional feedback resistors (not shown). The transimpedance amplifier 106 may be configured to receive an input current signal that is output from the resonator 115, and convert it to a voltage signal. The transimpedance amplifier 106 may be configured to feed the voltage signal to the phase detector circuitry 125.

The phase detector circuitry 125 may be configured to receive the signal from the transimpedance amplifier 106. The phase detector circuitry 125 may be configured to detect a phase from this received signal. The phase detector circuitry 125 may be configured to, for example, feed an output signal into the charge pump 108. The charge pump 108 may be configured to sink or source current in a load capacitor (not shown), resulting in a voltage signal. The resulting voltage signal may represent a phase delta across the resonator 115. This voltage signal may then be filtered, via a filter (not shown), to remove its high frequency content before being transmitted to the converter 109. In other examples, the phase detector circuitry 125 may operate as a bang-bang charge pump phase frequency detector that is configured to supply current pulses with fixed total charge to the capacitor acting as an integrator.

The converter 109 may include an analog-to-digital converter. The output of the phase detector circuitry 125 may be digitized by the ADC 109, which is then fed to the proportional integral derivative controller 130. Through this technique, the proportional integral derivative controller 130 may be purely a digital block. An output of the proportional integral derivative controller 130 may comprise a temperature correction signal. In some examples, the temperature correction signal does not need to be converted before being used by the polynomial circuitry 112 and the frequency synthesizer 525.

The lock range controller 111 may be configured to allow the proportional integral derivative controller 130 to restrict a range of frequencies generated as a source frequency for the resonator 115. This will prevent the oscillator system 500 from locking into undesired spurious MEMS resonant modes, and also allow for a faster start-up time.

An input to the resonator 115 may be controlled and therefore always kept at a desirable frequency. Consequently, the output signal of the proportional integral derivative controller 130 serves as a control signal for the feedback loop. In some examples, because the signal from the feedback loop, via the output signal from the proportional integral derivative controller 130, may change in a non-linear manner, the polynomial circuitry 112 may be used whose output is N. The frequency synthesizer 525 may be configured to receive the output N from the polynomial circuitry 112. For example, the frequency synthesizer 525 may be instructed by the polynomial circuitry 112 as to what multiplier it needs to multiply by, for example multiply $f_{ref}$ by N, where N may be an integer or a rational number, to obtain frequency output ($F_{out}$).

Figure 5:
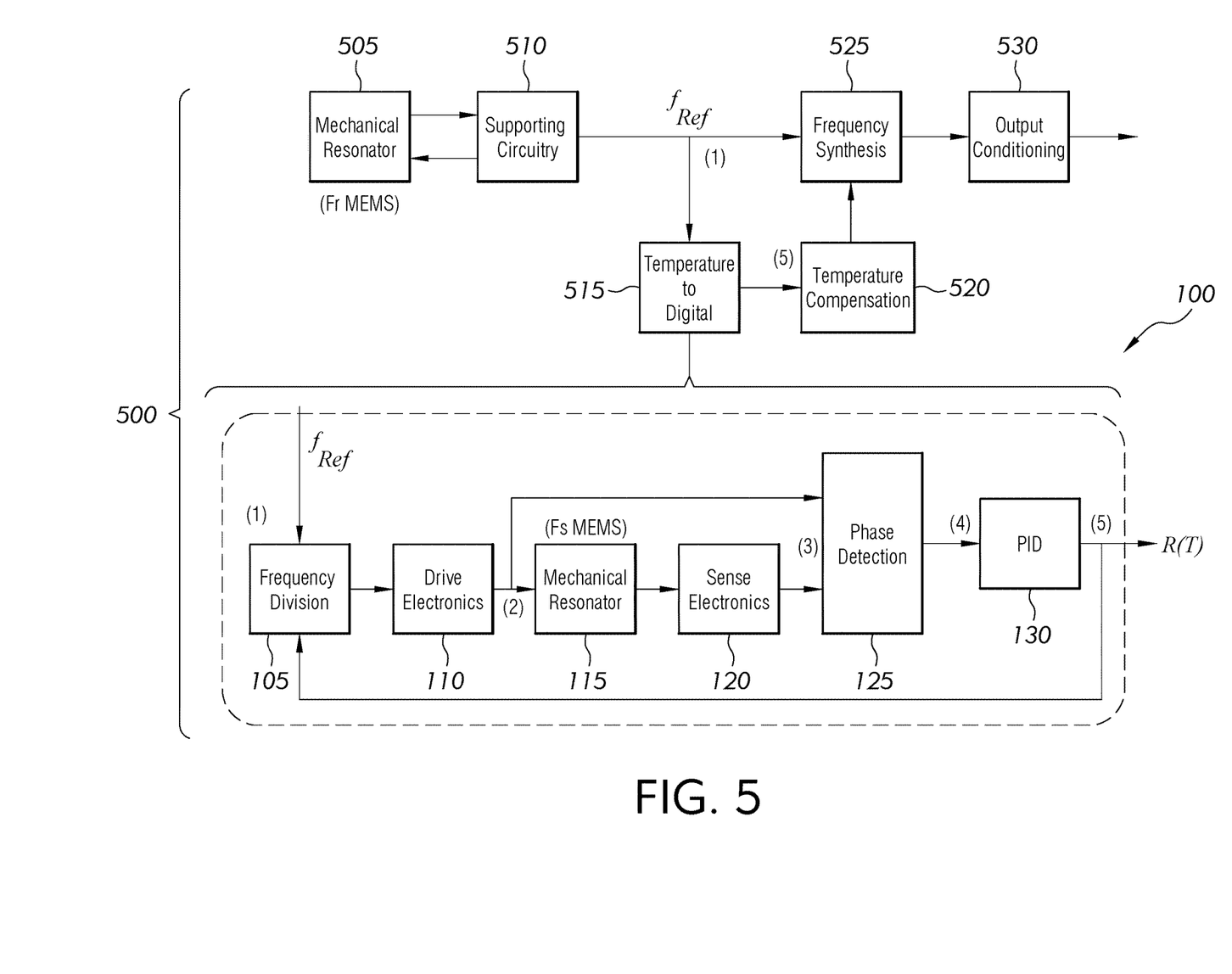
FIG. 5 illustrates an oscillator system according to an example embodiment.

FIG. 5 illustrates an oscillator system 500 according to an example embodiment. Without limitation, the oscillator may comprise a temperature compensated oscillator. The oscillator system 500 may include a resonator 505, supporting circuitry 510, a correction circuit 515, a temperature compensator 520, a frequency synthesizer 525, and output conditioner 530. The correction circuit 515 may include any of the correction circuits 100, as previously described above. The supporting circuitry 510 may operate in a similar manner to that of drive circuitry 110 and sense circuitry 120, as described below. For example, the supporting circuitry 510 may be configured to amplify and buffer a signal from resonator 505. An output of the supporting circuitry 510, including the amplified and buffered signal, may be configured to mechanically stimulate the resonate modes of the resonator 505 so as to allow the resonator to have energy to sense the resonance. The supporting circuitry 510 may further be configured to amplify the measured resonance of the resonator 505. Because the output sense signals of the resonator 505 may be small, they must be amplified prior to being used. The supporting circuitry 510 may include one or more amplifiers that are configured to carry out the respective amplification, as explained above. The frequency synthesizer 525 may be configured to include a phase-locked loop (PLL), such as a fractional-N PLL circuit, and a time-domain divider. The output conditioner 530 may be configured to provide a buffered output ($f_{output}$) to a device user. The output conditioner 530 may be configured to include a signal converter. In some examples, the buffered output ($f_{output}$) of the output conditioner 530 may include a low voltage CMOS clipped sine wave output.

The oscillator system 500 may be configured to detect, in real-time, frequency shifts from a nominal value using a nested-MEMS architecture. In particular, two MEMS resonators, 505 and 115, may be used, at different natural resonant frequencies, to generate a source frequency and a temperature compensation signal. One of the two MEMS resonators, such as the primary MEMS resonator 505, may be configured to generate a reference clock. The other of the two MEMS resonators, such as the secondary MEMS resonator 115, may be configured to generate a frequency correction signal that may be used to correct frequency errors due to stresses for external temperature changes. The resonator 505 and supporting circuitry 510 may be referred to as a primary oscillator or reference oscillator, and the components of the correction circuit 515 or 100 may be referred to as a secondary oscillator or nested oscillator. Accordingly, the resonator 505 may be referred to as the primary resonator or reference resonator, and the resonator 115 may be referred to as the secondary resonator or nested resonator.

The correction circuit 515 may include frequency division circuitry 105; drive circuitry 110; a resonator 115; sense circuitry 120; phase detector circuitry 125; and a proportional integral derivative controller 130.

A feedback loop may be utilized by the oscillator system 500 and configured to maintain a zero-degree phase shift of an AC drive signal through a resonator 115. In some examples, the resonator 115 may comprise a secondary MEMS resonator or a nested resonator. An input signal to the feedback loop may be sourced by a primary MEMS resonator 505. The input signal may comprise the source frequency for a frequency division circuit, such as the frequency division circuitry 105. The frequency division circuitry 105 may be configured to receive and condition, such as divide a frequency of, a reference signal, such as the reference clock ($f_{ref}$). The frequency division circuitry 105 may be configured to generate a drive signal for the resonator 115. The drive signal may be driven by drive circuitry 110. Input and output channels of the resonator 115 may be each fed into the phase detector circuitry 125. For example, the drive signal that is input to the resonator 115 may be transmitted directly to the phase detector circuitry 125. An output of the resonator 115 may be transmitted to the phase detector circuitry 125 via sense circuitry 120. The drive circuitry 110 may be configured to amplify and buffer the reference signal conditioned by the frequency division circuitry 105. An output of the drive circuitry 110, including the amplified and buffered signal, may be configured to mechanically stimulate the resonate modes of the resonator 115 so as to allow the resonator to have energy to sense the resonance. The sense circuitry 120 may be configured to amplify the measured resonance of the resonator 115. Because the output sense signals of the resonator 115 may be small, they must be amplified prior to being used by the phase detector circuitry 125. The drive circuitry 110 and the sense circuitry 120 may each include one or more amplifiers that are configured to carry out the respective amplification, as explained above.

The phase detector circuitry 125 may be configured to receive a plurality of input signals and generate at least one output signal. An output of the phase detector circuitry 125, such as the at least one output signal, may serve as an input to the proportional integral derivative controller 130. The proportional integral derivative controller 130 may be configured to adjust a frequency of an input to the frequency division circuitry 105 and drive frequency to the resonator 115. By maintaining a zero-degree phase shift through the resonator 115, the drive frequency of the resonator 115 is ensured to be at a natural.

An output signal of the proportional integral derivative controller 130 may be a function of a frequency of the primary MEMS resonator 505 and a frequency of the secondary MEMS resonator 115. In some examples, this function may be configured to take into account one or more parameters, such as aging, stress, or the like. The primary MEMS resonator 505 and the secondary MEMS resonator 115 may be assumed or configured to experience the same temperature conditions and have a highly correlated resonant frequency response to temperature changes. The output signal of the proportional integral derivative controller 130 may be configured as a temperature correction signal.

The frequency synthesizer 525 may be configured to use the primary MEMS resonator 505 as a source frequency, and the output signal of the proportional integral derivative controller 130 as a temperature correction signal.

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

In this description, numerous specific details have been set forth. It is to be understood, however, that implementations of the disclosed technology may be practiced without these specific details. In other instances, well-known methods, structures and techniques have not been shown in detail in order not to obscure an understanding of this description. References to "some examples," "other examples," "one example," "an example," "various examples," "one embodiment," "an embodiment," "some embodiments," "example embodiment," "various embodiments," "one implementation," "an implementation," "example implementation," "various implementations," "some implementations," etc., indicate that the implementation(s) of the disclosed technology so described may include a particular feature, structure, or characteristic, but not every implementation necessarily includes the particular feature, structure, or characteristic. Further, repeated use of the phrases "in one example," "in one embodiment," or "in one implementation" does not necessarily refer to the same example, embodiment, or implementation, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A correction circuit, comprising:
   frequency division circuitry that is configured to receive a reference signal;
   drive circuitry that is configured to receive and condition the reference signal from the frequency division circuitry;
   a first resonator that is configured to receive the reference signal from the drive circuitry;
   sense circuitry that is configured to receive the reference signal from the first resonator;
   phase detector circuitry that is configured to generate at least one output signal based on receipt of a plurality of input signals from the drive circuitry and the sense circuitry; and
   a proportional integral derivative controller that is configured to generate a temperature correction signal to correct frequency error in an oscillator based on receipt of the at least one output signal from the phase detector circuitry.

2. The correction circuit of claim 1, wherein the reference signal includes a reference clock signal.

3. The correction circuit of claim 1, wherein the reference signal is generated by a second resonator.

4. The correction circuit of claim 1, wherein the drive circuitry is configured to generate and supply a drive signal to the first resonator.

5. The correction circuit of claim 1, wherein the phase detector circuitry is configured to receive a first input signal of the plurality of input signals, the first input signal comprising a signal that is not passed through the first resonator.

6. The correction circuit of claim 5, wherein the phase detector circuitry is configured to receive a second input signal of the plurality of input signals, the second input signal comprising a signal that is passed through the first resonator and the sense circuitry.

7. The correction circuit of claim 3, wherein the temperature correction signal is a function of a frequency of the second resonator and a frequency of the first resonator.

8. The correction circuit of claim 1, wherein the correction circuit is configured to utilize a feedback loop to maintain a zero-degree phase shift of an AC drive signal through the first resonator.

9. The correction circuit of claim 1, wherein the first resonator comprises a plurality of channels.

10. The correction circuit of claim 9, wherein a first channel of the plurality of channels includes an input channel that is fed directly to the phase detector circuitry, and a second channel of the plurality of channels includes an output channel that is fed to the phase detector circuitry via the sense circuitry.

11. The correction circuit of claim 1, wherein the proportional integral derivative controller is configured to adjust an input of the frequency division circuitry.

12. The correction circuit of claim 1, wherein the frequency division circuitry includes a phase-locked loop, a frequency divider, or any combination thereof.

13. The correction circuit of claim 1, further comprising a transimpedance amplifier configured to receive an output from the first resonator.

14. The correction circuit of claim 1, further comprising a converter configured to convert the at least one output signal from phase detector circuitry into a digital signal.

15. The correction circuit of claim 14, wherein the converter is configured to transmit the digital signal to the proportional integral derivative controller.

16. The correction circuit of claim 1, further comprising a lock range controller configured to control the proportional integral derivative controller to restrict a range of frequencies generated as a source frequency for the first resonator.

17. The correction circuit of claim 1, further comprising a charge pump that is configured to receive the at least one output signal from the phase detector circuitry.

18. An oscillator system comprising:
a first resonator;
a correction circuit; and
output conditioner circuitry, wherein the correction circuit includes:
frequency division circuitry that is configured to receive a reference signal from the first resonator;
drive circuitry that is configured to receive the reference signal from the frequency division circuitry;
a second resonator that is configured to receive the reference signal from the drive circuitry, the second resonator;
sense circuitry that is configured to receive the reference signal from the second resonator;
phase detector circuitry that is configured to generate at least one output signal based on receipt of a plurality of input signals from the drive circuitry and the sense circuitry; and
a proportional integral derivative controller that is configured to generate a temperature correction signal to correct frequency error in the oscillator based on receipt of the at least one output signal from the phase detector circuitry.

19. The oscillator system of claim 18, wherein the temperature correction signal is a function of both natural frequencies from the first resonator and the second resonator.

20. A method comprising:
receiving, by frequency division circuitry, a reference signal;
conditioning, by drive circuitry, the reference signal from the frequency division circuitry;
receiving, by a first resonator, the reference signal from the drive circuitry;
receiving, by sense circuitry, the reference signal from the first resonator;
generating, by phase detector circuitry, at least one output signal based on receipt of a plurality of input signals from the drive circuitry and the sense circuitry; and
generating, by a proportional integral derivative controller, a temperature correction signal to correct frequency error in an oscillator based on receipt of the at least one output signal from the phase detector circuitry.

* * * * *